United States Patent
Jin et al.

(10) Patent No.: US 10,026,685 B2
(45) Date of Patent: Jul. 17, 2018

(54) METAL-OXIDE-METAL (MOM) CAPACITOR WITH REDUCED MAGNETIC COUPLING TO NEIGHBORING CIRCUIT AND HIGH SERIES RESONANCE FREQUENCY

(71) Applicant: QUALCOMM Incorporated, San Diego, CA (US)

(72) Inventors: Zhang Jin, San Diego, CA (US); Tao Yang, San Diego, CA (US); Tsai-Pi Hung, San Diego, CA (US); Mohammad Farazian, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 341 days.

(21) Appl. No.: 14/866,111

(22) Filed: Sep. 25, 2015

(65) Prior Publication Data

US 2017/0093362 A1 Mar. 30, 2017

(51) Int. Cl.
*H01L 23/522* (2006.01)
*H03H 7/00* (2006.01)
*H01L 23/528* (2006.01)

(52) U.S. Cl.
CPC ...... *H01L 23/5223* (2013.01); *H01L 23/5227* (2013.01); *H03H 7/004* (2013.01); *H01L 23/5286* (2013.01)

(58) Field of Classification Search
CPC . H03H 7/004; H01L 23/5223; H01L 23/5286; H01L 23/5227
USPC .................... 333/12, 175; 257/532; 361/271
See application file for complete search history.

(56) References Cited

U.S. PATENT DOCUMENTS

| | | | |
|---|---|---|---|
| 6,924,967 B1 | 8/2005 | Devoe | |
| 7,038,296 B2 | 5/2006 | Laws | |
| 7,262,952 B2 | 8/2007 | Lee et al. | |
| 7,760,485 B1 | 7/2010 | Gamliel | |
| 8,064,189 B2 | 11/2011 | Masuda et al. | |
| 2008/0079117 A1 | 4/2008 | Baumgartner et al. | |
| 2008/0186654 A1 | 8/2008 | Takeshima et al. | |
| 2010/0177457 A1 | 7/2010 | Willard | |
| 2015/0145615 A1 | 5/2015 | Jing et al. | |

FOREIGN PATENT DOCUMENTS

| | | |
|---|---|---|
| JP | 2003297930 A | 10/2003 |
| JP | 2012227204 A | 11/2012 |

OTHER PUBLICATIONS

International Search Report and Written Opinion—PCT/US2016/051358—ISA/EPO—dated Dec. 1, 2016.

*Primary Examiner* — Robert J Pascal
*Assistant Examiner* — Jorge Salazar, Jr.
(74) *Attorney, Agent, or Firm* — Loza & Loza, LLP/Qualcomm (57) ABSTRACT

Metal-oxide-metal (MOM) type capacitors include a first terminal configured to receive a first voltage, the first terminal being formed on a first dielectric layer; a first set of fingers formed on the first dielectric layer, the first set of fingers being coupled to the first terminal via a conductive trace formed on a second dielectric layer; a second terminal configured to receive second voltage, the second terminal being formed on the first dielectric layer; and a second set of fingers formed on the first dielectric layer, the second set of fingers being coupled to the second terminal, wherein the fingers of the second set are interspersed with the fingers of the first set.

4 Claims, 8 Drawing Sheets

METAL-OXIDE-METAL (MOM) CAPACITOR WITH REDUCED MAGNETIC COUPLING TO NEIGHBORING CIRCUIT AND HIGH SERIES RESONANCE FREQUENCY

BACKGROUND

Field

Aspects of the present disclosure relate generally to capacitors, and more particularly, to a metal-oxide-metal (MOM) type capacitor with reduced magnetic coupling to neighboring circuit and high series resonance frequency (SRF).

Background

Integrated circuits (ICs) are being designed to have greater density of circuit components. One such component is a metal-oxide-metal (MOM) capacitor. Often, in an IC, a plurality of MOM capacitors are employed for a variety of purposes. For example, an IC may employ a plurality of MOM capacitors coupled between a power supply rail and ground. One purpose of such MOM capacitors is to reduce a drop in the voltage (e.g., VDD) of the power supply rail when a circuit coupled to the rail draws a substantial amount of current. The MOM capacitors, which store charge, supply charge to the power supply rail to reduce the drop in the power rail voltage.

A MOM capacitor typically consists of a first terminal for coupling to a source of a first voltage potential (e.g., a power supply rail) and a second terminal for coupling to a source of a second voltage potential (e.g., ground). The first and second terminals are typically disposed on a dielectric layer. The MOM capacitor further consists of a first set of spaced-apart fingers (e.g., metallization strips) also disposed on the dielectric layer. The first set of fingers are electrically coupled to the first terminal and extend substantially in parallel toward the second terminal.

The MOM capacitor further consists of a second set of spaced-apart fingers (e.g., metallization strips) also disposed on the dielectric layer. The second set of fingers are electrically coupled to the second terminal and extend substantially in parallel toward the first terminal. The second set of fingers are respectively configured such that at least some of them are each situated between adjacent fingers of the first set. The spacing between fingers of the first set and fingers of the second set is small enough to form significant capacitive coupling between them.

When there is a change in a difference between the first voltage (e.g., VDD) applied to the first terminal and the second voltage (e.g., ground) applied to the second terminal, current flow is generated along the first and second sets of fingers. The current flow in the first and second sets of fingers are in the same direction (e.g., from the first terminal towards the second terminal, or vice-versa). As such, the electromagnetic field created by the current in a finger constructively combines with the electromagnetic field created by the current in an adjacent finger. This results in the MOM capacitor generating a substantial overall electromagnetic field that can affect neighboring circuits. Additionally, as such, the MOM capacitor exhibits a high parasitic inductance, which causes the MOM capacitor to have an inherent low series resonance frequency (SRF).

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

An aspect of the disclosure relates to an apparatus including a capacitor comprising a first terminal disposed on a first dielectric layer, wherein the first terminal is electrically connected to a source of a first voltage potential; a first set of fingers disposed on the first dielectric layer, wherein the first set of fingers are electrically coupled to the first terminal by way of an electrically conductive trace disposed on a second dielectric layer; a second terminal disposed on the first dielectric layer, wherein the second capacitor terminal is electrically connected to a source of a second voltage potential; and a second set of fingers disposed on the first dielectric layer, wherein the second set of fingers are electrically coupled to the second terminal, wherein at least some of the fingers of the second set are each situated between adjacent pairs of fingers of the first set and extend substantially parallel therewith.

Another aspect of the disclosure relates to a method comprising applying a first voltage to a first terminal of a capacitor, wherein the first terminal is disposed on a first dielectric layer; and applying a second voltage to a second terminal of the capacitor, wherein the second terminal is disposed on the first dielectric layer; wherein the capacitor comprises a first set of fingers disposed on the first dielectric layer, wherein the first set of fingers are electrically coupled to the first terminal by way of an electrically conductive trace disposed on a second dielectric layer; and a second set of fingers disposed on the first dielectric layer, wherein the second set of fingers are electrically coupled to the second terminal, wherein at least some of the fingers of the second set are each situated between adjacent pairs of fingers of the first set and extend substantially parallel therewith.

Another aspect of the disclosure relates to an apparatus comprising means for applying a first voltage to a first terminal of a capacitor, wherein the first terminal is disposed on a first dielectric layer; and means for applying a second voltage to a second terminal of the capacitor, wherein the second terminal is disposed on the first dielectric layer; wherein the capacitor comprises a first set of fingers disposed on the first dielectric layer, wherein the first set of fingers are electrically coupled to the first terminal by way of an electrically conductive trace disposed on a second dielectric layer; and a second set of fingers disposed on the first dielectric layer, wherein the second set of fingers are electrically coupled to the second terminal, wherein at least some of the fingers of the second set are each situated between adjacent pairs of fingers of the first set and extend substantially parallel therewith.

To the accomplishment of the foregoing and related ends, the one or more embodiments comprise the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the description embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1A:
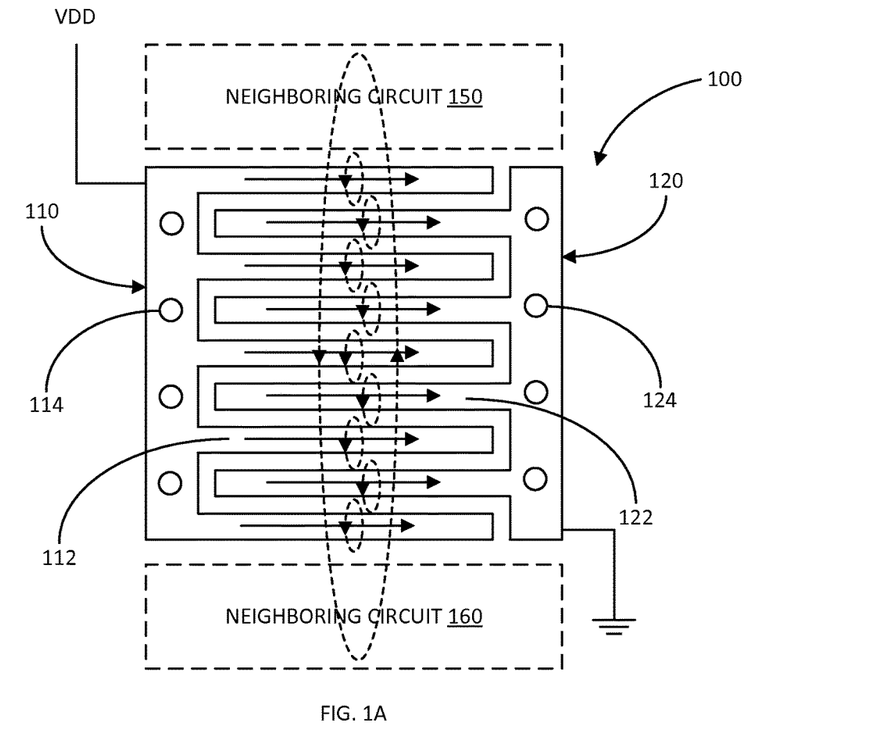
FIG. 1A illustrates a top view of an exemplary metal-oxide-metal (MOM) type capacitor in accordance with an aspect of the disclosure.

FIG. 1A illustrates a top view of an exemplary metal-oxide-metal (MOM) type capacitor 100 in accordance with an aspect of the disclosure. The MOM capacitor 100 comprises a first terminal 110, which may be configured for electrical connection to a source of a first voltage potential (e.g., VDD). The first terminal 110 may be configured as an electrical conductor (e.g., a patterned metallization layer) disposed on a dielectric layer (not shown in FIG. 1A). The MOM capacitor 100 further comprises a first set of spaced-apart fingers 112 (e.g., elongated electrically-conductive strips) electrically coupled to the first terminal 110 and extending therefrom in a substantially parallel manner. The first set of fingers 112 are also formed on the dielectric layer.

Similarly, the MOM capacitor 100 comprises a second terminal 120, which may be configured for electrical connection to a source of a second voltage potential (e.g., ground). The second terminal 120 may also be configured as an electrical conductor (e.g., a patterned metallization layer) disposed on the dielectric layer. The MOM capacitor 100 further comprises a second set of spaced-apart fingers 122 (e.g., elongated electrically-conductive strips) electrically coupled to the second terminal 120 and extending therefrom in a substantially parallel manner. The second set of fingers 122 are also formed on the dielectric layer.

The fingers of the first set 112 are interspersed with the fingers of the second set 122 in a substantially parallel and spaced-apart manner. In other words, at least some of the fingers of the first set 112 are each situated between adjacent fingers of the second set 122. Conversely, at least some of the fingers of the second set 122 are each situated between adjacent fingers of the first set 112. As discussed, the fingers of the first set 112 extend substantially parallel with the fingers of the second set 122. Further, the fingers of the first set 112 are spaced apart from the fingers of the second set 122 such that they are capacitively coupled, but not electrically connected.

In operation, a change in a difference between the first and second voltage potentials produces longitudinal current flow along the fingers of the first and second set. For example, as illustrated, the current (represented as arrowed solid lines) flows from the first terminal 110 towards the second terminal 120 along the fingers of the first and second sets 112 and 122.

Each of the current flowing along the fingers of the first and second sets 112 and 122 produces an individual electromagnetic (EM) field (represented as a small dashed ellipse surrounding the corresponding finger). The individual EM field associated with a current in one finger constructively combines with the individual EM field associated with a current in an adjacent finger. This is because the currents in the fingers flow in the same direction (e.g., from the first terminal 110 towards the second terminal 120). As a result, the MOM capacitor 100 generates a substantial overall EM field (represented as a large dashed ellipse surrounding the first and second sets of fingers). As illustrated, the overall EM field generated by the MOM capacitor 100 may adversely affect the operation of neighboring circuits 150 and 160.

Figure 1B:
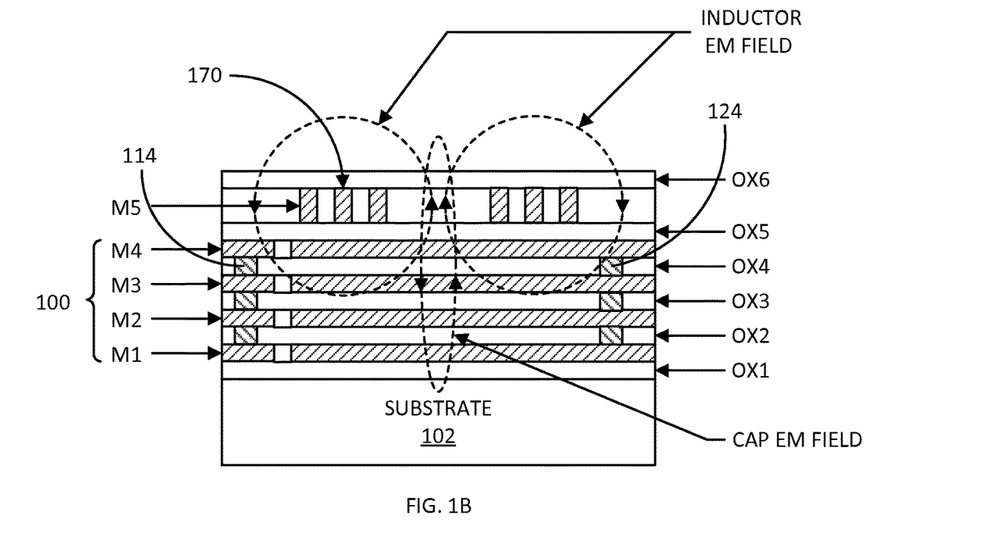
FIG. 1B illustrates a side cross-sectional view of the MOM type capacitor of FIG. 1A with an overlying inductor in accordance with another aspect of the disclosure.

FIG. 1B illustrates a side cross-sectional view of the MOM capacitor 100 with an overlying inductor 170 in accordance with another aspect of the disclosure. As illustrated, the MOM capacitor 100 may be implemented on a plurality of layers. For example, the first terminal 110, first set of fingers 112, second terminal 120, and second set of fingers may be implemented as substantially identical electrically-conductive layers M1, M2, M3, and M4 disposed on electrically-insulating (dielectric layers (e.g., oxide layers)) OX1, OX2, OX3, and OX4, respectively. The metallization layers M1, M2, M3, and M4 and oxide layers OX1, OX2, OX3, and OX4 may be disposed in a substantially vertically-stacked manner above an IC substrate 102.

A first set of electrically-conductive (e.g., metallized) via holes 114 may electrically couple together the first terminal portions 110 implemented on layers M1, M2, M3, and M4. Similarly, a second set of electrically-conductive (e.g., metallized) via holes 124 may electrically couple together the second terminal portions 120 implemented on layers M1, M2, M3, and M4. The currents in the fingers of the first and second sets 112 and 122 in every layer of the MOM capacitor 100 also flow in the same direction; and hence, produce a relatively large overall EM field (CAP EM field), as represented by the vertically-oriented dashed ellipse depicted in FIG. 1B.

Also illustrated in FIG. 1B, the inductor 170 is formed above the MOM capacitor 100. For example, the inductor 170 may be configured as a spiral inductor comprising an electrically-conductive (e.g., metallization) layer M5 patterned into a spiral with input and output ports. The inductor 170 may be formed on an electrically-insulating layer (dielectric layer (e.g., oxide layer)) OX5 disposed over the top metallization layer M4 of the MOM capacitor 100. A passivation (electrically-insulating) layer OX6 may be disposed over the inductor 170 to protect the inductor and other components underlying the passivation layer OX6.

As illustrated, during operation, the inductor 170 also generates an electromagnetic field (inductor EM field). Because the inductor 170 is situated over the MOM capacitor 100, the CAP EM field may adversely affect or interfere with the inductor EM field. Thus, as explained with reference to FIGS. 1A-1B, the EM field generated by the MOM capacitor 100 may not only adversely affect neighboring circuits 150 and 160 that are laterally spaced-apart from the capacitor 100, but also vertically spaced-apart from the capacitor 100, such as inductor 170.

Another drawback of the MOM capacitor 100 is that the relatively large EM field causes the capacitor to exhibit a relatively large series parasitic inductance. As such, the MOM capacitor 100 may be modeled as a capacitor coupled in series with an inductor. Accordingly, at low frequency, below the resonance frequency of the series capacitor-inductor, the inductor functions as a wire; and hence, the MOM capacitor 100 functions basically as the intended capacitor. At higher frequency, near or above the resonance frequency, the impedance of the parasitic inductance is higher; and hence, the MOM capacitor 100 no longer functions as the intended capacitor. Thus, another drawback of the MOM capacitor 100 is that it inherently has a relatively low series resonance frequency (SRF), which limits the intended function of the capacitor to frequency well below the SRF.

Figure 2:
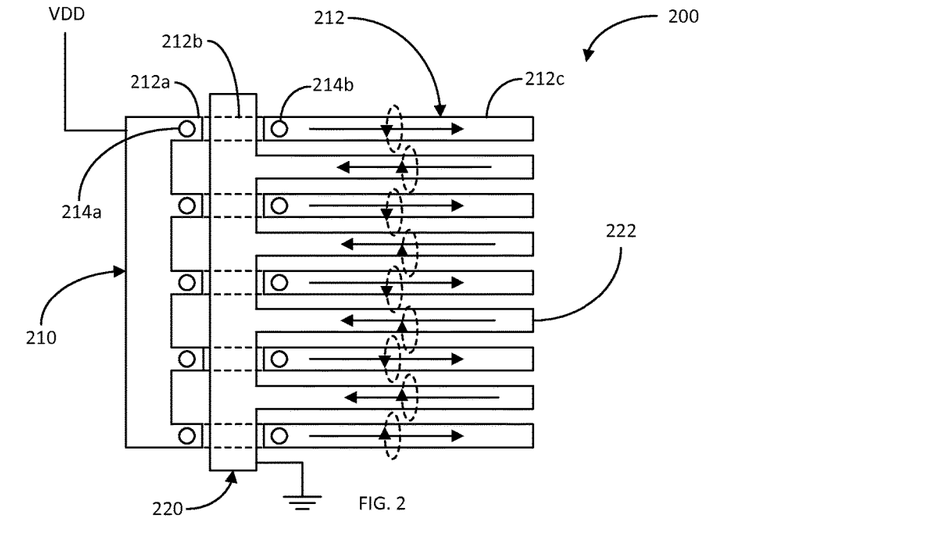
FIG. 2 illustrates a top view of another exemplary metal-oxide-metal (MOM) type capacitor in accordance with another aspect of the disclosure.

FIG. 2 illustrates a top view of another exemplary metal-oxide-metal (MOM) type capacitor 200 in accordance with another aspect of the disclosure. In summary, the MOM capacitor 200 is configured to reduce the overall EM field generated, as well as to increase the SRF of the capacitor. This is accomplished by having the current flow along the first set of fingers to be in the opposite direction as the current flow along the second set of fingers. Additionally, MOM capacitor 200 is configured such that the first and second terminals are located on the same layer to facilitate circuit routing to and from the capacitor.

In particular, the MOM capacitor 200 comprises a first terminal 210 for electrical connection to a source of a first voltage potential (e.g., VDD). The first terminal 210 may be configured as an electrically-conductive pad (e.g., a portion of a patterned metallization layer) disposed on a first dielectric layer (not shown in FIG. 2). The MOM capacitor 200 further comprises a first set of spaced-apart fingers 212 (e.g., electrically-conductive strips) electrically coupled to the first terminal 210, and extending therefrom in a substantially parallel manner.

The first set of fingers 212 include respective first portions 212a disposed on the first dielectric layer and electrically connected directly to the first terminal 210. The first set of fingers 212 include respective second portions 212b disposed on a second dielectric layer (not shown in FIG. 2), represented as a dashed line to indicate that its disposed on another layer. The second dielectric layer may be below or above the first dielectric layer. The second portions 212a are electrically coupled to the first portions 212a by way of electrically-conductive (e.g., metallized) via holes 214a. The first set of fingers 212 include respective third portions 212c disposed on the first dielectric layer. The third portions 212c are electrically coupled to the second portions 212b by way of electrically-conductive (e.g., metallized) via holes 214b.

The MOM capacitor 200 comprises a second terminal 220 for electrical connection to a source of a second voltage potential (e.g., ground). The second terminal 220 may be configured as an electrically-conductive pad (e.g., a portion of a patterned metallization layer) disposed on the first dielectric layer. In this example, portions of the second terminal 220 are situated directly over or under the second portions 212b of the first set of fingers 212. The MOM capacitor 200 further comprises a second set of spaced-apart fingers 222 (e.g., electrically-conductive strips) electrically coupled to the second terminal 220, and extending therefrom in a substantially parallel manner. The second set of fingers 222 are disposed on the first dielectric layer.

The third portions 212c of the fingers of the first set 212 are interspersed with the fingers of the second set 222 in a substantially parallel and spaced-apart manner. In other words, at least some of the finger portions 212c of the first set 212 are each situated between adjacent fingers of the second set 222. Conversely, at least some of the fingers of the second set 222 are each situated between adjacent finger portions 212c of the first set 212. As discussed, the finger portions 212c of the first set 212 extend substantially parallel with the fingers of the second set 222. Further, the finger portions 212c of the first set 212 are spaced apart from the fingers of the second set 222 such that they are capacitively coupled, but not electrically connected.

In operation, a change in a difference between the first and second voltage potentials produces longitudinal current flow along the fingers of the first and second sets 212 and 222. For example, as illustrated, current (represented as arrowed solid lines) flows from the first terminal 210 along the first set of fingers 212 towards the ends of the fingers. In contrast, current flows along the second set of fingers 222 from the ends of the fingers 222 towards the second terminal 220. Accordingly, the current flow along the first set of fingers 212 is in opposite direction as the current flow along the second set of fingers 222.

Each of the current flowing along the fingers of the first and second sets 212 and 222 produces an individual electromagnetic (EM) field (represented as a small dashed ellipse surrounding the corresponding finger). The individual EM field associated with a current in one finger destructively combines with the individual EM field associated with a current in an adjacent finger. This is because the currents in the fingers flow in opposite direction. As a result, the MOM capacitor 200 generates a substantially reduced overall EM field.

Accordingly, the MOM capacitor 200 has the advantage of reducing electromagnetic interference with lateral and/or vertical neighboring circuits and devices. Additionally, the reduced overall EM field generated by the MOM capacitor 200 causes the capacitor to exhibit a relatively low series parasitic inductance. As a result, the MOM capacitor 200 has an inherent high series resonance frequency (SRF). This allows the MOM capacitor 200 to be used for its intended capacitance function over a wider frequency range.

Figure 3A:
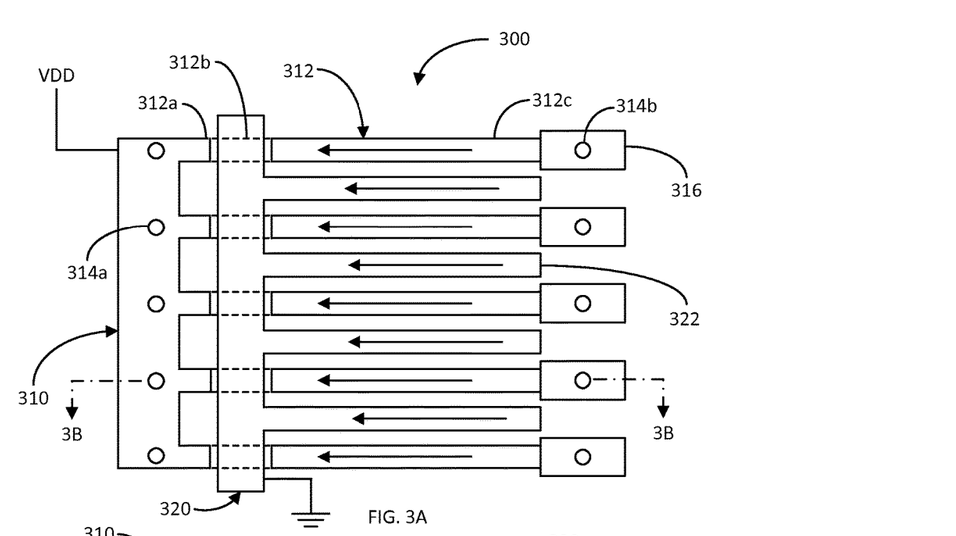
FIGS. 3A-3B illustrate top and side cross-sectional views of another exemplary metal-oxide-metal (MOM) type capacitor in accordance with another aspect of the disclosure.
Figure 3B:
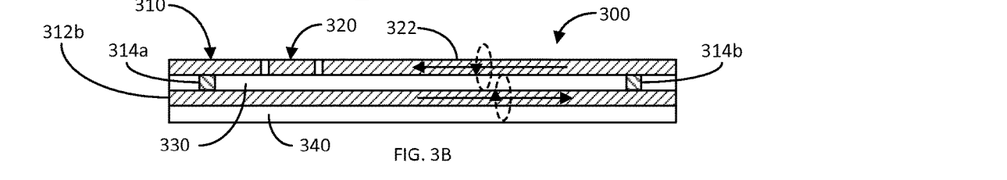

FIGS. 3A-3B illustrate top and side cross-sectional views of another exemplary metal-oxide-metal (MOM) type capacitor 300 in accordance with another aspect of the disclosure. In summary, the MOM capacitor 300 is similar to that of MOM capacitor 200, except that the electrically-conductive (e.g., metallized) via holes are instead situated directly below or above the first terminal and separate pads electrically connected to ends of the first set of fingers. There may be manufacturing and reliability reasons for not positioning metallized via holes directly below or above fingers of a MOM capacitor.

In particular, the MOM capacitor 300 comprises a first terminal 310 for electrical connection to a source of a first voltage potential (e.g., VDD). The first terminal 310 is formed on a first dielectric layer 330. The MOM capacitor 300 further comprises a first set of spaced-apart fingers 312 electrically coupled to the first terminal 310 and extending therefrom in a substantially parallel manner. Similar to MOM capacitor 200, the first set of fingers 312 includes: (1) first portions 312a disposed on the first dielectric layer 330 and directly connected to the first terminal 310; (2) second portions 312b disposed on a second dielectric layer 340 (shown below, but could be above, the first dielectric layer 330) and electrically connected to the first terminal 310 by way of electrically-conductive (e.g., metallized) via holes 314a; and (3) third portions 312c disposed on the first dielectric layer 330 and electrically connected to the second portions 312b by way of respective pads 316 disposed on the first dielectric layer 330 and electrically-conductive (e.g., metallized) via holes 314b.

The MOM capacitor 300 further comprises a second terminal 320 for electrical connection to a source of a second voltage potential (e.g., ground). The second terminal 320 is disposed on the first dielectric layer 330. In this example, portions of the second terminal 320 are situated directly over or under the second portions 312b of the first set of fingers 312. The MOM capacitor 300 further comprises a second set of spaced-apart fingers 322 electrically coupled to the second terminal 320, and extending therefrom in a substantially parallel manner. The second set of fingers 322 are disposed on the first dielectric layer 330.

The third portions 312c of the fingers of the first set 312 are interspersed with the fingers of the second set 322 in a substantially parallel and spaced-apart manner. In other words, at least some of the finger portions 312c of the first set 312 are each situated between adjacent fingers of the second set 322. Conversely, at least some of the fingers of the second set 322 are each situated between adjacent finger portions 312c of the first set 312. As discussed, the finger portions 312c of the first set 312 extend substantially parallel with the fingers of the second set 322. Further, the finger portions 312c of the first set 312 are spaced apart from the fingers of the second set 322 such that they are capacitively coupled, but not electrically connected.

Similar to MOM capacitor 200, the MOM capacitor 300, in response to a change in difference between the first and second voltage potentials, generates a substantially reduced overall EM field due to currents along the first and second sets of fingers 312 and 322 flowing in opposite direction as currents flowing along fingers 312b. The MOM capacitor 300 also has a higher series resonance frequency (SRF) to allow the MOM capacitor to be used for its intended capacitance function over a wider frequency range. Because the metallized via holes 314a and 314b are not situated directly over or under any of the fingers, the MOM capacitor 300 may be more easily manufacturable and have less reliability problems.

Figure 4:
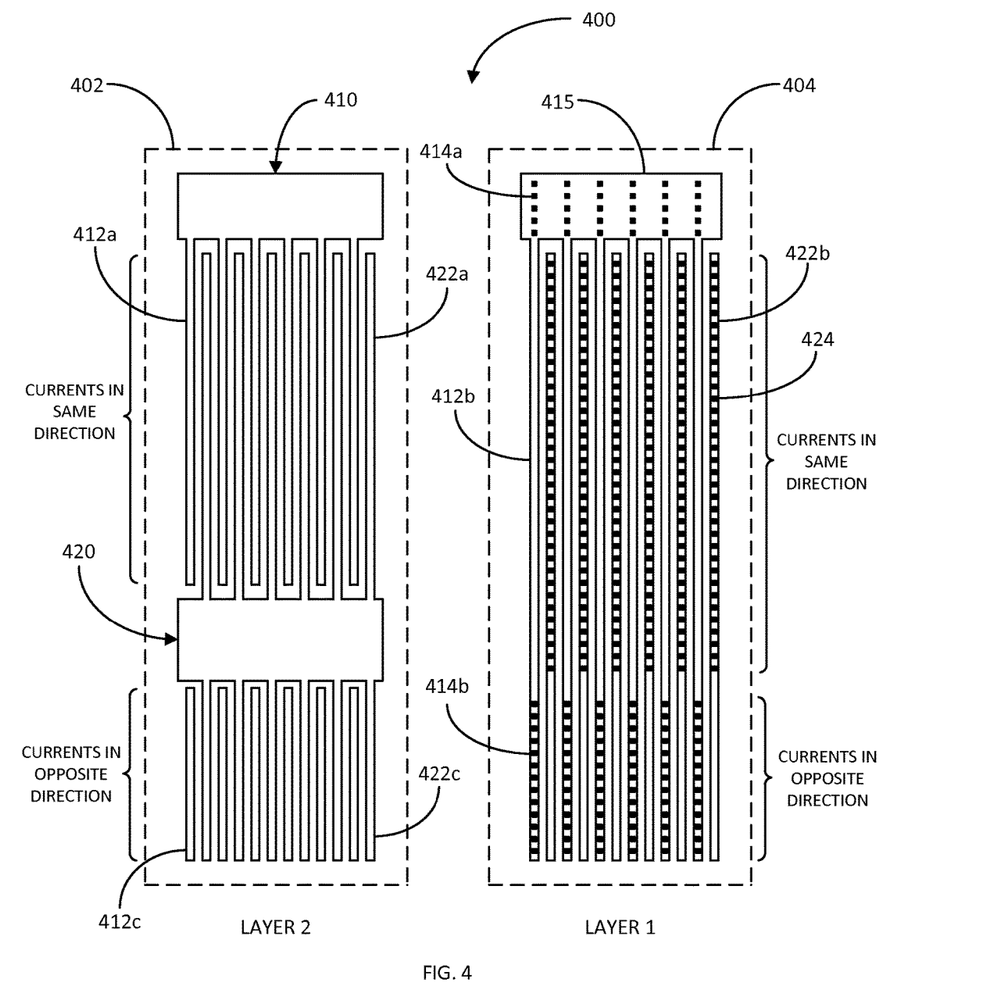
FIG. 4 illustrates top views of separate layers of an exemplary metal-oxide-metal (MOM) type capacitor in accordance with another aspect of the disclosure.

FIG. 4 illustrates top views of separate layers of an exemplary metal-oxide-metal (MOM) type capacitor 400 in accordance with another aspect of the disclosure. In summary, the MOM capacitor 400 may be an exemplary more detailed version of MOM capacitor 200 previously discussed, with some additional features as discussed in more detail herein. As illustrated, the MOM capacitor 400 comprises a first layer 1 (depicted on the right), which may be configured as a lower layer. The MOM capacitor 400 further comprises a second layer 2 (depicted on the left), which may be configured as an upper layer.

With reference to the second layer 2, the MOM capacitor 400 comprises a first terminal 410 for electrical connection to a first voltage potential. The MOM capacitor 400 further comprises a second terminal 420 for electrical connection to a second voltage potential. The first and second terminals 410 and 420 are formed on a dielectric layer 402 (e.g., an oxide layer).

The MOM capacitor 400 comprises a set of spaced-apart fingers 412a electrically coupled to the first terminal 410, and extending therefrom in a substantially parallel manner towards the second terminal 420. Additionally, the MOM capacitor 400 comprises another set of spaced-apart fingers 422a electrically coupled to the second terminal 420, and extending therefrom in a substantially parallel manner towards the first terminal 410. The sets of fingers 412a and 422a are disposed on the dielectric layer 402. The set of fingers 412a are interspersed with the set of fingers 422a, as previously discussed.

The MOM capacitor 400 further comprises a set of spaced-apart fingers 422c electrically coupled to the second terminal 420, and extending therefrom in a substantially parallel manner in a direction away from the first terminal 410. The MOM capacitor further comprises a set of spaced-apart fingers 412c extending substantially parallel and interspersed with the set of fingers 422c. The sets of fingers 412c and 422c are disposed on the dielectric layer 402.

With reference to the first layer 1, the MOM capacitor 400 comprises a set of spaced-apart fingers 412b extending substantially parallel with and directly below the sets of fingers 412a and 412c. Portions of the set of fingers 412b terminate at a metallization pad 415, which may be configured similar to and directly underlies the first terminal 410. The metallization pad 415 is electrically connected to the first terminal 410 by way of a plurality of electrically-conductive (e.g., metallized) via holes 414a. The set of fingers 412b are also electrically connected to the set of fingers 412c by way of a plurality of electrically-conductive (e.g., metallized) via holes 414b. The set of fingers 412b including the metallization pad 415 are disposed on a dielectric layer 404 (e.g., an oxide layer).

The MOM capacitor 400 further comprises a set of spaced-apart fingers 422b extending substantially parallel and interspersed with the set of fingers 412b. The set of fingers 422b are disposed on the dielectric layer 404. The set of fingers 422b also extend substantially parallel with and directly below the sets of fingers 422a and 422c. The set of fingers 422b are electrically connected to the second set of fingers 422a and the second terminal 420 by way of a plurality of electrically-conductive (e.g., metallized) via holes 424.

The overall capacitance of the MOM capacitor 400 is formed by the different sections of interspersed fingers, such as sections 412a/422a, 412b/422b, and 412c/422c. A change in a difference between the first and second voltage potentials applied respectively to the first and second terminals 410 and 420 produces current to flow along the sets of fingers 412a, 422a, 412b, 422b, 412c, and 422c. The current flow along the sets of fingers 412a and 422a are in the same direction. The current flow along the sets of fingers 412b and 422b at a region directly below the sets of fingers 412a and 422a are in the same direction. The current flow along the sets of fingers 412b and 422b at a region directly blow the sets of fingers 412c and 422c are in opposite direction. And, the current flow along the sets of fingers 412c and 422c are in opposite direction.

Since at least some of the currents in adjacent fingers flow in opposite direction, the MOM capacitor 400 generates a reduced EM field. Most of the EM field generated by the MOM capacitor 400 occurs in the interspersed finger section 412a/422a and 412b/422b directly below 412a/422a, where the currents in adjacent fingers flow in the same direction. The reason for this section 412a/422a may be two folds: (1) to allow for some spacing between the first and second terminals 410 and 420 to facilitate connections to these terminals; and (2) to increase the overall capacitance of the MOM capacitor 400 because, although this section 412a/422a generates some the EM field, it does provide additional capacitance between the first and second terminals 410 and 420.

Figure 5:
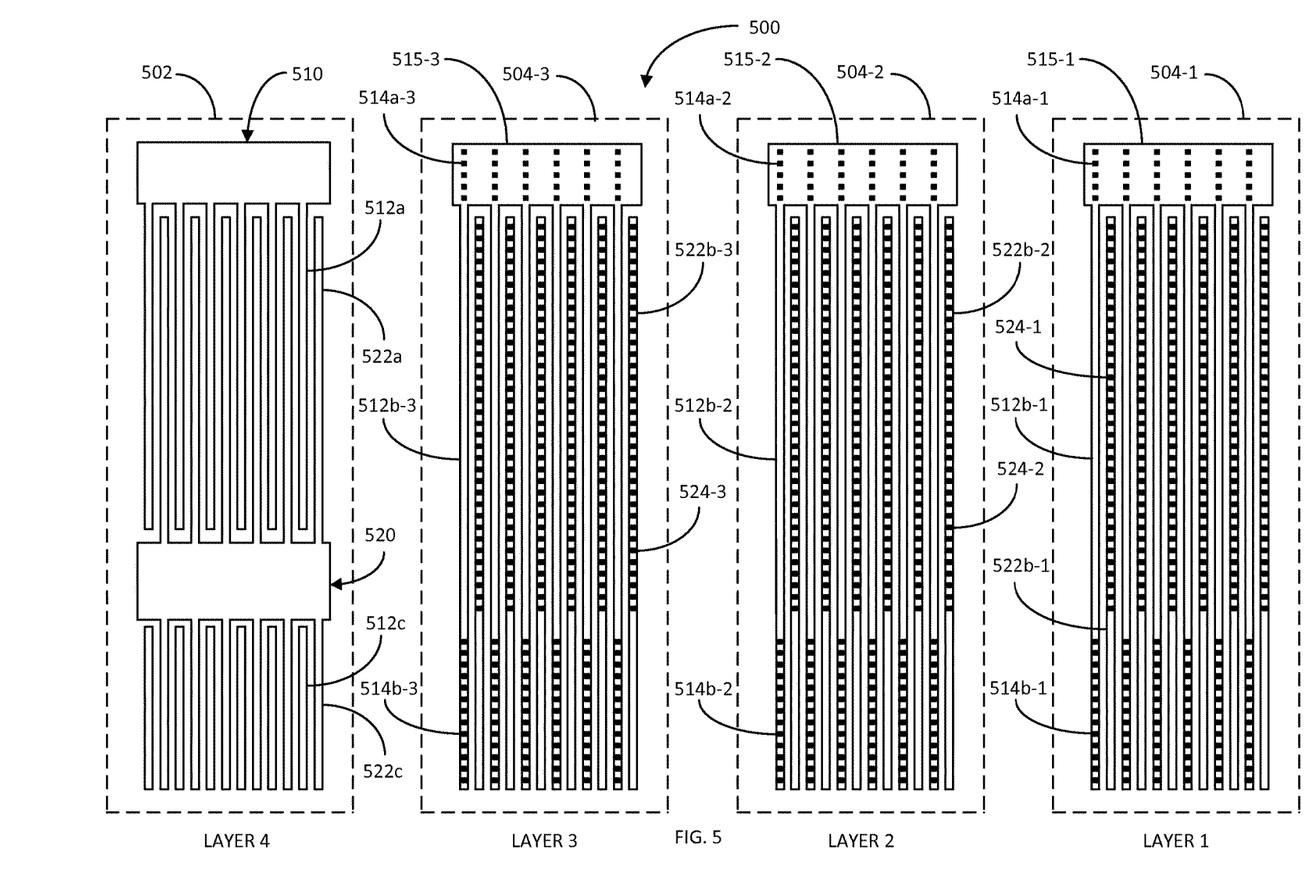
FIG. 5 illustrates top views of separate layers another metal-oxide-metal (MOM) type capacitor in accordance with another aspect of the disclosure.

FIG. 5 illustrates top views of separate layers of another exemplary metal-oxide-metal (MOM) type capacitor 500 in accordance with another aspect of the disclosure. The MOM capacitor 500 is similar to that of MOM capacitor 400, but includes two more layers for additional capacitance. It shall be understood that the MOM capacitor 500 may include only one additional layer beyond the layers of MOM capacitor 400, or more than two additional layers beyond the layers of MOM capacitor 400.

The MOM capacitor 500 comprises first layer 1, second layer 2, third layer 3, and fourth layer 4, which may be situated from lowest to highest in that order. In the following description, elements of MOM capacitor 500 that are the same as or similar to elements of MOM capacitor 400 are identified with the same reference numbers, except with the most significant digit being a "5" instead of a "4," and some with additional suffixes to indicate corresponding layer.

More specifically, the fourth layer 4 (e.g., uppermost layer) of MOM capacitor 500 may be configured substantially the same as the second layer 2 of MOM capacitor 400. Thus, the MOM capacitor 500 comprises first and second terminals 510 and 520, a section of interspersed fingers 512a/522a, and another section of interspersed fingers 512c/522c, all of which are formed on a dielectric layer 502 (e.g., an oxide layer).

The first, second, and third layers 1, 2, 3 of MOM capacitor 500 may be configured substantially the same as the first layer 1 of MOM capacitor 400. Thus, the MOM capacitor 500 comprises a section of interspersed fingers 512b-1/522b-1 formed on a dielectric layer 504-1 (e.g., an oxide layer) associated with the first layer 1; a section of interspersed fingers 512b-2/522b-2 formed on a dielectric layer 504-2 (e.g., an oxide layer) associated with the second layer 2; and a section of interspersed fingers 512b-3/522b-3 formed on a dielectric layer 504-3 (e.g., an oxide layer) associated with the third layer 3.

The first terminal 510 is electrically coupled to sets of fingers 512b-3, 512b-2, and 512b-2 by way of electrically-conductive (e.g., metallized) via holes and metallization pads 514a-3/515-3, 514a-2/515-2, and 514a-1/515-1, respectively. The metallization pads 515-3, 515-2, and 515-1 are disposed on dielectric layers 504-3, 504-2, and 504-1, respectively. The second terminal 520 and the set of fingers 522a are electrically coupled to sets of fingers 522b-3, 522b-2, and 522b-1 by way of electrically-conductive (e.g., metallized) via holes 524-3, 524-2, and 524a-1, respectively. And, the set of fingers 512c are electrically coupled to sets fingers 512b-3, 512b-2, and 512b-1 by way of electrically-conductive (e.g., metallized) via holes 514b-3, 514b-2, and 514b-1, respectively.

As such, the MOM capacitor 500 is basically the same as that of MOM capacitor 400, with additional capacitance provided by the interspersed finger sections of the first and second layers 1 and 2. The currents in the interspersed finger section 512a/522a flow in the same direction; and hence, produces some EM field. The currents in the interspersed finger section 522c/512c flow in opposite direction; and hence, does not produce significant EM field. The respective currents in the interspersed finger sections 512b-1/522b-1, 512b-2/522b-2, and 512b-3/522b-3 directly below section 512a/522a flow in the same direction, respectively; and hence, produce some EM field. The respective currents in the interspersed finger sections 512b-1/522b-1, 512b-2/522b-2, and 512b-3/522b-3 directly below section 512c/522c flow in opposite direction, respectively; and hence, do not produce significant EM field.

Thus, the MOM capacitor 500 is configured to provide substantial capacitance because of all of the interspersed fingers, and yet produce a reduced EM field because only a portion of the entire interspersed fingers has currents flowing in the same direction.

Figure 6:
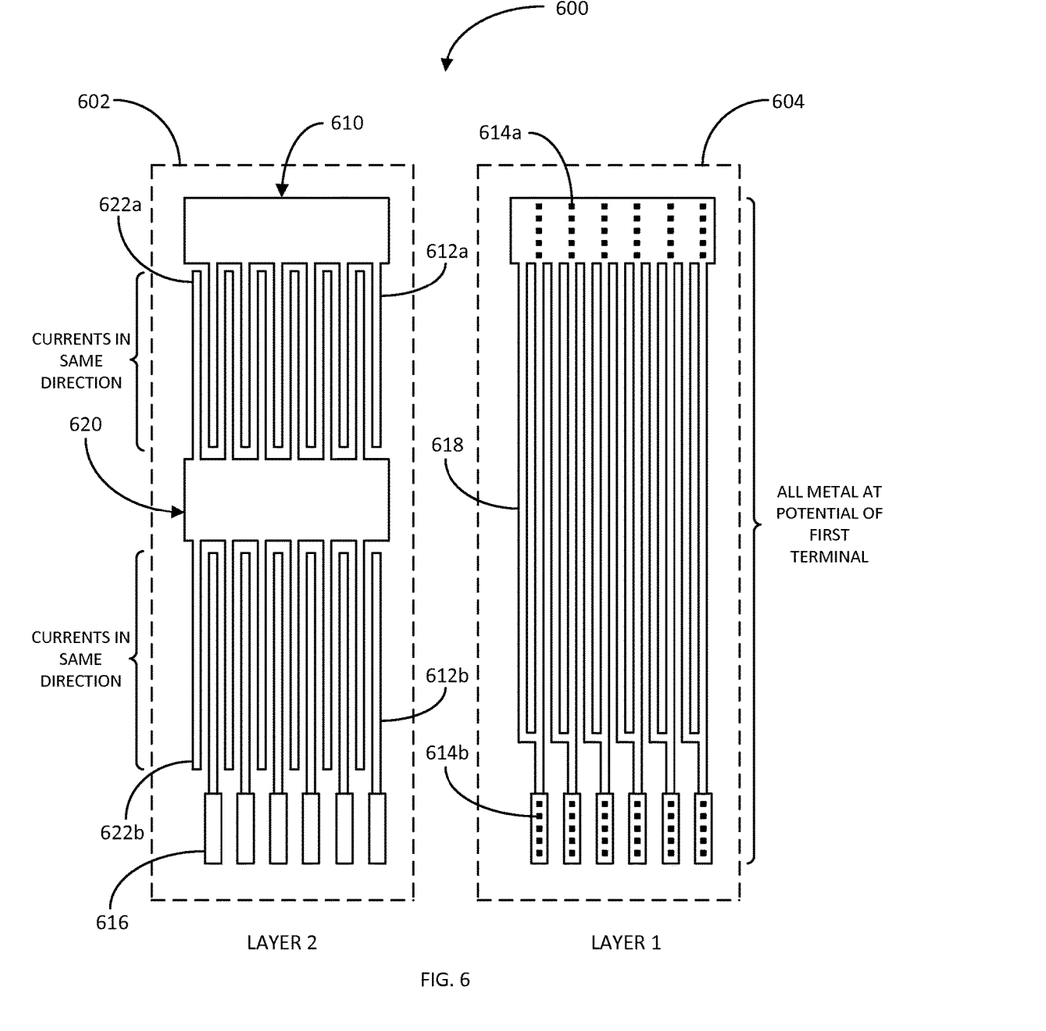
FIG. 6 illustrates top views of separate layers of yet another exemplary metal-oxide-metal (MOM) type capacitor in accordance with another aspect of the disclosure.

FIG. 6 illustrates top views of separate layers of another exemplary metal-oxide-metal (MOM) type capacitor 600 in accordance with another aspect of the disclosure. The MOM capacitor 600 may be an exemplary more detailed implementation of the MOM capacitor 300, previously discussed. That is, unlike MOM capacitor 400, the MOM capacitor 600 does not have electrically-conductive (e.g., metallized) via holes directly below or above fingers. As previously discussed, there may be manufacturing and reliability reasons for not positioning via holes directly below or above fingers.

In particular, considering the second layer 2, the MOM capacitor 600 comprises a first terminal 610 for electrical connection to a source of a first voltage potential (e.g., VDD), and a second terminal 620 for electrical connection to a source of a second voltage potential (e.g., ground). The first and second terminals 610 and 620 are formed on a dielectric layer 602 (e.g., an oxide layer).

The MOM capacitor 600 further comprises a set of spaced-apart fingers 612a electrically coupled to the first terminal 610, and extending therefrom towards the second terminal 620 in a substantially parallel manner. The MOM capacitor 600 further comprises a set of spaced-apart fingers 622a electrically coupled to the second terminal 620, and extending therefrom towards the first terminal 610 in a substantially parallel manner. The fingers of set 612a are interspersed with the fingers of set 622a. Both sets of fingers 612a and 622a are formed on the dielectric layer 602.

The MOM capacitor 600 further comprises a set of spaced-apart fingers 622b electrically coupled to the second terminal 620, and extending therefrom in a substantially parallel manner and in a direction away from the first terminal 610. The MOM capacitor 600 further comprises a set of spaced-apart fingers 612b interspersed with the set of fingers 622b. Additionally, the MOM capacitor 600 comprises a plurality of electrically-conductive pads 616 coupled to ends of the finger of the set 612b, respectively. The sets of fingers 612b and 622b, as well as the pads 616, are disposed on the dielectric layer 602.

With reference to the first layer 1, the MOM capacitor 600 comprises a patterned electrically-conductive (e.g., metallization) trace 618 formed on a dielectric layer 604 (e.g., an oxide layer). In this example, the entire electrically-conductive trace 618 is electrically coupled to the first terminal 610 by way of electrically-conductive (e.g., metallized) via holes 614a. Similarly, the entire electrically-conductive trace 618 is electrically coupled to the electrically-conductive pads 616 by way of electrically-conductive (e.g., metallized) via holes 614b. In this example, the electrically-conductive trace 618 is patterned into parallel conductive strips extending from an electrically-conductive pad upon which the via holes 614a are electrically connected, to a plurality of electrically-conductive pads upon which separate sets of the via holes 614b are electrically connected, respectively.

The overall capacitance of the MOM capacitor 600 is formed by the different sections of interspersed fingers, such as sections 612a/622a and 612b/622b. A change in a difference between the first and second voltage potentials applied respectively to the first and second terminals 610 and 620 produces current to flow along the sets of fingers 612a, 622a, 612b, and 622b. The currents in the sets of fingers 612a and 622a flow in the same direction from the first terminal 610 towards the second terminal 620. The currents in the sets of fingers 612b and 622b flow in the same direction from the electrically-conductive pads 616 towards the second terminal 620. The current flow along the electrically-conductive trace 618 is from the via holes 614a towards the via holes 614b.

Most of the EM field generated by the MOM capacitor 600 occurs in the interspersed finger sections 612a/622a and 612b/622b, where the currents in adjacent fingers flow in the same direction. Also, some EM field is generated by the current flowing in the electrically-conductive trace 618 in a region directly below the section 612a/622a, as the current along trace 618 is in the same direction as the current along the section 612a/622a. Some EM field cancellation occurs in the region of trace 618 directly below section 612b/622b, as the current along the electrically-conductive trace 618 in that region is opposite to the direction of the current in section 612b/622b.

The reason for this section 612a/622a may be two folds: (1) to allow some spacing between the first and second terminals 610 and 620 to facilitate connections to these terminals; and (2) to increase the overall capacitance of the MOM capacitor 600 because, although this section 612a/622a generates some EM field, it does provide additional capacitance between the first and second terminals 610 and 620.

Figure 7:
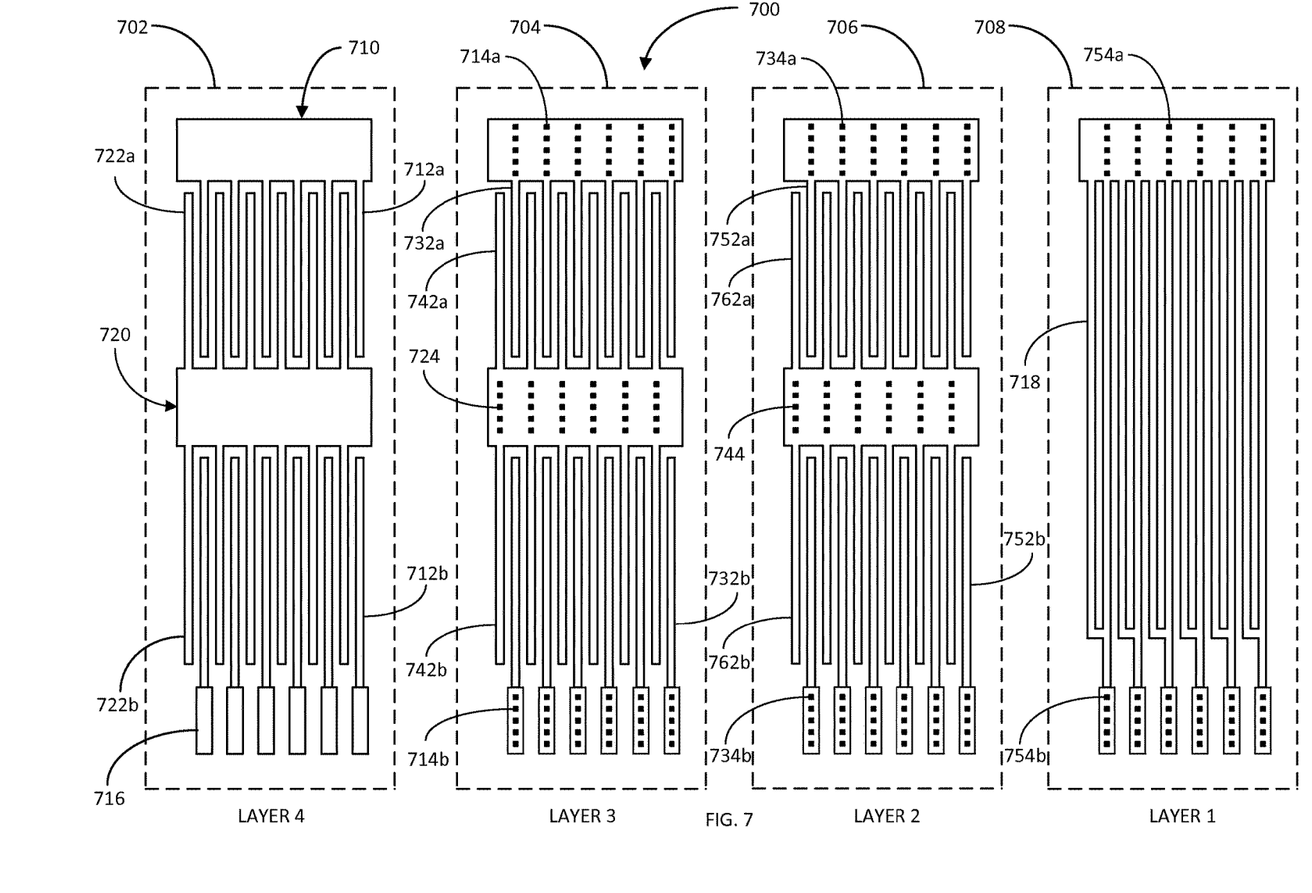
FIG. 7 illustrates top views of separate layers of still another exemplary metal-oxide-metal (MOM) type capacitor in accordance with another aspect of the disclosure.

FIG. 7 illustrates top views of separate layers of an exemplary metal-oxide-metal (MOM) type capacitor 700 in accordance with another aspect of the disclosure. The MOM capacitor 700 is similar to that of MOM capacitor 600, but includes two more layers for additional capacitance. In particular, the MOM capacitor 600 comprises first layer 1, second layer 2, third layer 3, and fourth layer 4, which may be situated from lowest to highest in that order. It shall be understood that the MOM capacitor 700 may include only one additional layer beyond the layers of MOM capacitor 600, or more than two additional layers beyond the layers of MOM capacitor 600.

The fourth layer 4 (e.g., uppermost layer) of MOM capacitor 700 may be configured substantially the same as the second layer 2 of MOM capacitor 600. That is, the MOM capacitor 700 comprises first and second terminals 710 and 720, a section of interspersed fingers 712a/722a, and another section of interspersed fingers 712b/722b, all of which are disposed on a dielectric layer 702 (e.g., an oxide layer). Also, the MOM capacitor 700 comprises electrically-conductive pads 716 coupled to respective ends of the fingers of set 712b. The pads 716 are disposed on the dielectric layer 702.

The first layer 1 of MOM capacitor 700 may be configured substantially the same as the first layer 1 of MOM capacitor 600. That is, the MOM capacitor 700 comprises a patterned electrically-conductive (e.g., metallization) trace 718 formed on a dielectric layer 708 (e.g., an oxide layer). Similarly, the entire electrically-conductive trace 718 is electrically coupled to the first terminal 710 by way of electrically-conductive (e.g., metallized) via holes 754a. Similarly, the entire electrically-conductive trace 718 is electrically coupled to the electrically-conductive pads 716 by way of electrically-conductive (e.g., metallized) via holes 754b. In this example, the electrically-conductive trace 718 is patterned into parallel conductive strips extending from an electrically-conductive pad upon which the via holes 754a are electrically connected, to a plurality of electrically-conductive pads upon which separate sets of the via holes 754b are electrically connected, respectively.

Considering the third layer 3, the MOM capacitor 700 comprises a set of spaced-apart fingers 732a extending substantially parallel with, and directly below the set of fingers 712a. The set of fingers 732a are electrically coupled to the first terminal 710 by way of a plurality of electrically-conductive (e.g., metallized) via holes 714a disposed on a corresponding electrically-conductive pad. The MOM capacitor 700 further comprises a set of spaced-apart fingers 742a extending substantially parallel with and directly below the set of fingers 722a. The set of fingers 742a are electrically coupled to the second terminal 720 by way of a plurality of electrically-conductive via holes 724 disposed on a corresponding pad. The set of fingers 742a are interspersed with the set of fingers 732a.

The MOM capacitor 700 further comprises a set of spaced-apart fingers 742b extending substantially parallel with and directly below the set of fingers 722b. The set of fingers 742b are electrically coupled to the second terminal 720 by way of electrically-conductive (e.g., metallized) via holes 724 disposed on the corresponding electrically-conductive pad. The MOM capacitor 700 also comprises a set of spaced-apart fingers 732b extending substantially parallel with and directly below the set of fingers 712b. The set of fingers 732b are electrically coupled to the first terminal 710 by way of electrically-conductive (e.g., metallized) via holes 714b disposed on corresponding electrically-conductive pad, respectively. All electrically-conductive elements of the third layer 3 are disposed on a dielectric layer 704 (e.g., an oxide layer).

Considering the second layer 2, the MOM capacitor 700 comprises a set of spaced-apart fingers 752a extending substantially parallel with and directly below the set of fingers 732a. The set of fingers 752a are electrically coupled to the first terminal 710 by way of a plurality of electrically-conductive (e.g., metallized) via holes 734a disposed on a corresponding electrically-conductive pad. The MOM capacitor 700 further comprises a set of spaced-apart fingers 762a extending substantially parallel with, and directly below the set of fingers 742a. The set of fingers 762a are electrically coupled to the second terminal 720 by way of a plurality of electrically-conductive via holes 744 disposed on a corresponding electrically-conductive pad. The set of fingers 762a are interspersed with the set of fingers 752a.

The MOM capacitor 700 further comprises a set of spaced-apart fingers 762b extending substantially parallel with and directly below the set of fingers 742b. The set of fingers 762b are electrically coupled to the second terminal 720 by way of electrically-conductive (e.g., metallized) via holes 744 disposed on the corresponding electrically-conductive pad. The MOM capacitor 700 also comprises a set of spaced-apart fingers 752b extending substantially parallel with, and directly below the set of fingers 732b. The set of fingers 752b are electrically coupled to the first terminal 710 by way of electrically-conductive (e.g., metallized) via holes 734b disposed on a corresponding electrically-conductive pad, respectively. All electrically-conductive elements of the second layer 2 are disposed on a dielectric layer 706 (e.g., an oxide layer).

The overall capacitance of the MOM capacitor 700 is formed by the different sections of interspersed fingers, such as sections 712a/722a, 712b/722b, 732a/742a, 732b/742b, 752a/762a, and 752b/762b. A change in a difference between the first and second voltage potentials applied respectively to the first and second terminals 710 and 720 produces currents to flow along the sets of fingers 712a, 722a, 712b, 722b, 732a, 742a, 732b, 742b, 752a, 762a, 752b, and 762b.

The currents in the interspersed finger section 712a/722a flow in the same direction (e.g., from the first terminal 710 towards the second terminal 720). The currents in the interspersed finger section 732a/742a flow in the same direction (e.g., from via holes 714a towards via holes 724). The currents in the interspersed finger section 752a/762a flow in the same direction (e.g., from via holes 734a towards via holes 744).

The currents in the interspersed finger section 712b/722b flow in same direction (e.g., from the pads 716 towards the second terminal 720). The currents in the interspersed finger section 732b/742b flow in same direction (e.g., from via holes 714b towards via holes 724). The currents in the interspersed finger section 752b/762b flow in same direction (e.g., from via holes 734b towards via holes 744).

The current flowing along electrically-conductive trace 718 in a region below sections 712a/722a, 732a/742a, and 752a/762a flow in the same direction as the current in those sections. The current flowing along electrically-conductive trace 718 in a region below sections 712b/722b, 732b/742b, and 752b/762b flow in the opposite direction as the current in those sections. Accordingly, EM field cancellation occurs in that region.

As previously discussed, the reason for this section 712a/722a may be two folds: (1) to allow for some spacing between the first and second terminals 710 and 720 to facilitate connections to these terminals; and (2) to increase the overall capacitance of the MOM capacitor 700 because, although this section 712a/722a generates some EM field, it does provide additional capacitance between the first and second terminals 710 and 720.

Figure 8A:
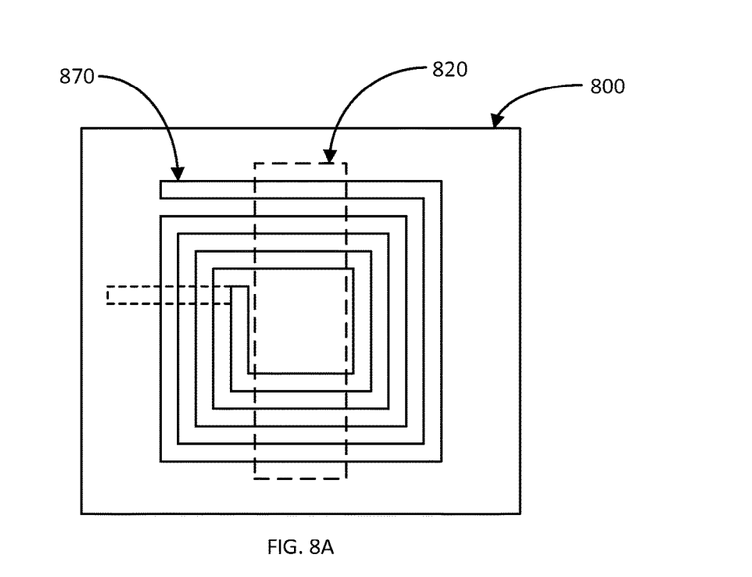
FIGS. 8A-8B illustrate top and side cross-sectional views of an exemplary inductor overlying an exemplary metal-oxide-metal (MOM) type capacitor in accordance with another aspect of the disclosure.
Figure 8B:
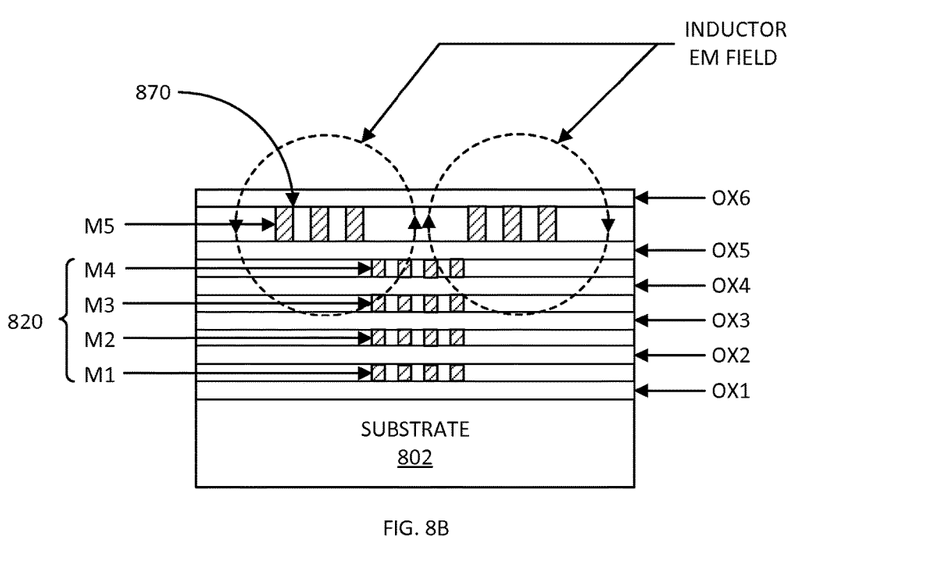

FIGS. 8A-8B illustrate top and side cross-sectional views of an exemplary integrated circuit (IC) 800 comprising a spiral inductor 870 overlying an exemplary metal-oxide-metal (MOM) type capacitor 820 in accordance with another aspect of the disclosure. In this example, the IC 800 comprises a substrate 802, five (5) electrically-conductive (e.g., metallization) layers M1, M2, M3, M4, and M5, and six (6) electrically-insulating (dielectric) layers (e.g., oxide layers) OX1, OX2, OX3, OX4, OX5, and OX6 layers.

The first oxide layer OX1 is situated between the substrate 802 and the first metallization layer M1. The second oxide layer OX2 is situated between the first and second metallization layers M1 and M2. The third oxide layer OX3 is situated between the second and third metallization layers M2 and M3. The fourth oxide layer OX4 is situated between the third and fourth metallization layers M3 and M4. The fifth oxide layer OX5 is situated between the fourth and fifth metallization layers M4 and M5. And, the sixth oxide layer OX6 is situated above the fifth metallization layer M5, and may serve as a passivation layer for the IC 800.

As illustrated, the spiral inductor 870 is primarily implemented on metallization layer M5. As illustrated in FIG. 8A, a portion of the inductor 870, represented by a short dashed rectangular, may be implemented on another layer (e.g., metallization layer M4) for connection to an inner end of the inductor 870. As illustrated in FIG. 8B, the MOM capacitor 820 is implemented on metallization layers M1 to M4. Also, as shown in FIG. 8A, the MOM capacitor 820 may be centrally-located below the spiral inductor 870. As the MOM capacitor 820 is configured to generate a reduced EM field, the MOM capacitor 820 being directly below the inductor 870 may not adversely affect the operation of the inductor 870.

Figure 9:
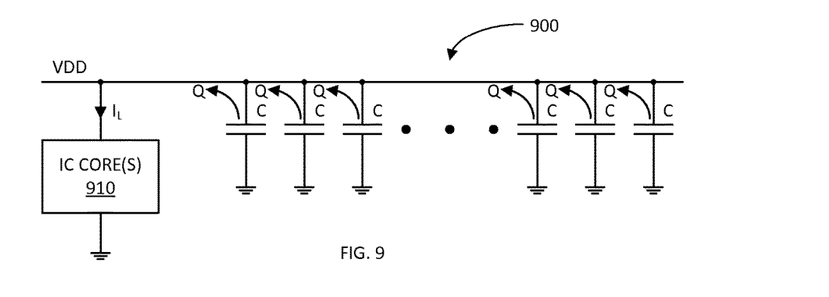
FIG. 9 illustrates a schematic diagram of an exemplary integrated circuit (IC) employing de-coupling metal-oxide-metal (MOM) type capacitors in accordance with another aspect of the disclosure.

FIG. 9 illustrates a schematic diagram of an exemplary integrated circuit (IC) 900 employing metal-oxide-metal (MOM) type capacitors as de-coupling capacitors in accordance with another aspect of the disclosure. In particular, the IC 900 comprises a plurality of MOM capacitors C coupled between a first voltage rail (e.g., VDD) and a second voltage rail (e.g., ground). The MOM capacitors C may be configured as per any of the embodiments described herein.

The IC 900 further comprises one or more IC core(s) 910 coupled between the first voltage rail (e.g., VDD) and the second voltage rail (e.g., ground). As the one or more IC core(s) 910 are enabled, the IC core(s) draws a load current $I_L$ from the first voltage rail. Due to non-ideal characteristics of the power source supplying the first rail voltage VDD, the load current $I_L$ may cause the first rail voltage VDD to drop. To counter this voltage drop, the plurality of MOM capacitors C, which collectively store charge Q, provide the charge Q to the IC core (s) as needed to resist the drop in the first rail voltage VDD.

Figure 10:
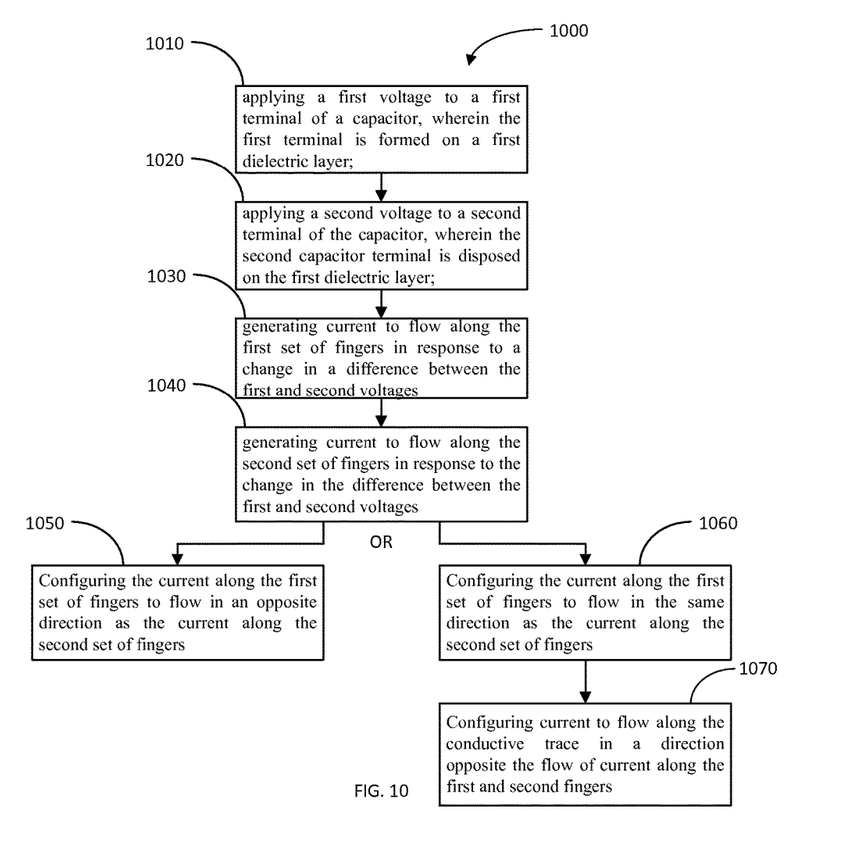
FIG. 10 illustrates a flow diagram of an exemplary method of operating a metal-oxide-metal (MOM) type capacitor in accordance with another aspect of the disclosure.

FIG. 10 illustrates a flow diagram of an exemplary method 1000 of operating a metal-oxide-metal (MOM) type capacitor in accordance with another aspect of the disclosure. The method 1000 comprises applying a first voltage to a first terminal of a capacitor, wherein the first capacitor terminal is disposed on a first dielectric layer (block 1010). The method 1000 further comprises applying a second voltage to a second terminal of the capacitor, wherein the second terminal is disposed on the first dielectric layer (block 1020).

In accordance with the method 1000, the capacitor comprises a first set of fingers formed on the first dielectric layer, wherein the first set of fingers are electrically coupled to the first terminal by way of an electrically conductive trace formed on a second dielectric layer; and a second set of fingers formed on the first dielectric layer, wherein the second set of fingers are electrically coupled to the second terminal, wherein at least some of the fingers of the second set are each situated between adjacent pairs of fingers of the first set and extend substantially parallel therewith.

Further, the method 1000 comprises generating current to flow along the first set of fingers in response to a change in a difference between the first and second voltages (block 1030). And, the method 1000 comprises generating current to flow along the second set of fingers in response to the change in the difference between the first and second voltages (block 1040).

The method 1000 may further comprise configuring the current along the first set of fingers to flow in an opposite direction as the current along the second set of fingers (block 1050). Or, alternative to block 1050, the method 1000 further comprises configuring the current along the first set of fingers to flow in the same direction as the current along the second set of fingers (block 1060); and configuring current to flow along the conductive trace disposed on the second dielectric layer to flow in a direction opposite the flow of current along the first and second sets of fingers (block 1070).

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. An apparatus, comprising:
    a capacitor comprising:
        a first terminal disposed on a first dielectric layer, wherein the first terminal is electrically connected to a source of a first voltage potential;
        a first set of fingers disposed on the first dielectric layer, wherein the first set of fingers are electrically coupled to the first terminal by way of an electrically conductive trace disposed on a second dielectric layer;
        a second terminal disposed on the first dielectric layer, wherein the second terminal is electrically connected to a source of a second voltage potential;
        a second set of fingers disposed on the first dielectric layer, wherein the second set of fingers are electrically coupled to the second terminal, wherein at least one of the fingers of the second set are each situated between adjacent pairs of fingers of the first set and extend substantially parallel therewith, wherein the first and second sets of fingers are configured such that a current flow along the first set of fingers is in an opposite direction as a current flow along the second set of fingers in response to a difference between the first and second voltage potentials;
        a third set of fingers disposed on the first dielectric layer, wherein the third set of fingers are electrically coupled to the first terminal; and
        a fourth set of fingers disposed on the first dielectric layer, wherein the fourth set of fingers are electrically coupled to the second terminal, wherein at least one of the fingers of the fourth set are each situated between adjacent pairs of fingers of the third set and extend substantially parallel therewith, and wherein a current in the third set of fingers flows in the same direction as a current in the fourth set of fingers in response to the difference between the first and second voltage potentials.

2. The apparatus of claim 1, further comprising an inductor disposed on a third dielectric layer directly above or below the capacitor.

3. An apparatus, comprising:
    a first voltage potential source configured to apply a first voltage to a first terminal of a capacitor, wherein the first terminal is disposed on a first dielectric layer;
    a second voltage potential source configured to apply a second voltage to a second terminal of the capacitor, wherein the second terminal is disposed on the first dielectric layer;
    the capacitor, comprising:
        a first set of fingers disposed on the first dielectric layer, wherein the first set of fingers are electrically coupled to the first terminal by way of an electrically conductive trace disposed on a second dielectric layer; and
        a second set of fingers disposed on the first dielectric layer, wherein the second set of fingers are electrically coupled to the second terminal, wherein at least one of the fingers of the second set are each situated between adjacent pairs of fingers of the first set and extend substantially parallel therewith; and
    wherein the first and second voltages or a different set of voltages are applied across an inductor disposed on a third dielectric layer directly above or below the capacitor.

4. An apparatus, comprising:
    a capacitor comprising:
        a first terminal disposed on a first dielectric layer, wherein the first terminal is electrically connected to a source of a first voltage potential;
        a first set of fingers disposed on the first dielectric layer, wherein the first set of fingers are electrically coupled to the first terminal by way of an electrically conductive trace disposed on a second dielectric layer;
        a second terminal disposed on the first dielectric layer, wherein the second terminal is electrically connected to a source of a second voltage potential;
        a second set of fingers disposed on the first dielectric layer, wherein the second set of fingers are electrically coupled to the second terminal, wherein at least one of the fingers of the second set are each situated between adjacent pairs of fingers of the first set and extend substantially parallel therewith, wherein the first and second sets of fingers are configured such that a current flow along the first set of fingers is in an opposite direction as a current flow along the second set of fingers in response to a difference between the first and second voltage potentials;
        a third set of fingers disposed on the second dielectric layer, wherein the third set of fingers are electrically coupled to the first terminal; and
        a fourth set of fingers disposed on the second dielectric layer, wherein the fourth set of fingers are electrically coupled to the second terminal, wherein at least one of the fingers of the fourth set are each situated between adjacent pairs of fingers of the third set and extend substantially parallel therewith, and wherein a current in the third set of fingers flows in the same direction as a current in the fourth set of fingers in response to the difference between the first and second voltage potentials.

* * * * *